US012341093B2

(12) United States Patent
Chang et al.

(10) Patent No.: US 12,341,093 B2
(45) Date of Patent: Jun. 24, 2025

(54) METHOD FOR PROTECTING ANTI-FUSE CELL

(71) Applicant: Taiwan Semiconductor Manufacturing Company Limited, Hsinchu (TW)

(72) Inventors: Meng-Sheng Chang, Chu-bei (TW); Chia-En Huang, Xinfeng Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/634,333

(22) Filed: Apr. 12, 2024

(65) Prior Publication Data
US 2024/0260258 A1 Aug. 1, 2024

Related U.S. Application Data

(62) Division of application No. 17/853,243, filed on Jun. 29, 2022, now Pat. No. 11,985,819, which is a division of application No. 16/732,214, filed on Dec. 31, 2019, now Pat. No. 11,527,541.

(51) Int. Cl.
*H10B 20/25* (2023.01)
*G11C 17/16* (2006.01)
*H01L 23/525* (2006.01)

(52) U.S. Cl.
CPC ........ *H01L 23/5252* (2013.01); *G11C 17/165* (2013.01); *H10B 20/25* (2023.02); *G11C 2213/79* (2013.01)

(58) Field of Classification Search
CPC .. H10B 20/25; G11C 17/165; G11C 2213/79; G11C 17/18; G11C 17/16; H01L 23/5252
See application file for complete search history.

(56) References Cited

U.S. PATENT DOCUMENTS

| 5,498,895 | A | * | 3/1996 | Chen | .......... | H01L 23/5252 |
| | | | | | | 257/50 |
| 2003/0151082 | A1 | * | 8/2003 | Kim | .......... | H10B 12/033 |
| | | | | | | 438/398 |
| 2003/0223291 | A1 | * | 12/2003 | Nachumovsky | .... | G11C 11/5692 |
| | | | | | | 257/E27.102 |
| 2007/0280012 | A1 | * | 12/2007 | Obayashi | .......... | G11C 29/028 |
| | | | | | | 257/E27.071 |
| 2013/0082325 | A1 | * | 4/2013 | Ito | .......... | H01L 21/76224 |
| | | | | | | 257/E29.256 |

(Continued)

OTHER PUBLICATIONS

Final Office Action on U.S. Appl. No. 16/732,214 Dtd Apr. 29, 2022.

(Continued)

*Primary Examiner* — S M Sohel Imtiaz
(74) *Attorney, Agent, or Firm* — FOLEY & LARDNER LLP

(57) ABSTRACT

A memory device includes an anti-fuse cell array having a plurality of anti-fuse cells, each of the plurality of anti-fuse cells having a first transistor and a second transistor connected to the first transistor. A first terminal of the first transistor is connected to a bit line and the bit line is a buried rail formed in a substrate of the first transistor and the second transistor.

20 Claims, 7 Drawing Sheets

(56) References Cited

U.S. PATENT DOCUMENTS

| | | | |
|---|---|---|---|
| 2013/0088907 A1* | 4/2013 | Kuo ................... | H01L 29/7855 |
| | | | 365/63 |
| 2015/0028411 A1* | 1/2015 | Lee ...................... | H10B 20/20 |
| | | | 257/330 |
| 2015/0187431 A1* | 7/2015 | Chung ............... | H01L 29/66136 |
| | | | 365/96 |
| 2015/0206595 A1* | 7/2015 | Jeong ................. | G11C 17/16 |
| | | | 365/96 |
| 2017/0154686 A1* | 6/2017 | Liaw ................... | H01L 29/7851 |
| 2017/0178704 A1* | 6/2017 | Loiseau .............. | H01L 27/0617 |
| 2017/0186756 A1* | 6/2017 | Choi ................... | H10B 43/27 |
| 2019/0251223 A1 | 8/2019 | Chang et al. | |
| 2019/0341119 A1* | 11/2019 | Liao .................... | G11C 17/18 |
| 2021/0265267 A1* | 8/2021 | Wu .................... | H01L 23/5283 |

OTHER PUBLICATIONS

Non-Final Office Action on U.S. Appl. No. 17/853,243 Dtd Oct. 13, 2023.

Notice of Allowance on U.S. Appl. No. 16/732,214 Dtd Jul. 27, 2022.

Notice of Allowance on U.S. Appl. No. 17/853,243 Dtd Jan. 30, 2024.

\* cited by examiner

METHOD FOR PROTECTING ANTI-FUSE CELL

CROSS-REFERENCE TO RELATED PATENT APPLICATIONS

This application is a divisional of U.S. patent application Ser. No. 17/853,243, filed on Jun. 29, 2022, which is a divisional of U.S. patent application Ser. No. 16/732,214, filed on Dec. 31, 2019, the entire disclosures of both of which are incorporated by reference herein.

BACKGROUND

The present disclosure relates generally to standard cell layout, and particularly to reducing resistance during program and read operations in the standard cell layout of an anti-fuse cell.

Integrated circuits are widely used in a variety of applications. Designing an integrated circuit is a multi-step process. Specifically, the design of an integrated circuit begins with a description of the functionality desired from the integrated circuit. From the functional description, a transistor level circuit is designed and a netlist that defines the connectivity of the various transistors in the circuit is developed. The netlist may be simulated and tested to verify that the circuit implements the desired functionality and to predict operating parameters. From the netlist, a standard cell layout is created of the circuit. The standard cell layout includes a placement of standard elements from a standard cell library and shows how those cells are interconnected. An anti-fuse memory cell is one type of a standard element. However, present day anti-fuse memory cells have limitations in the way they are configured.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
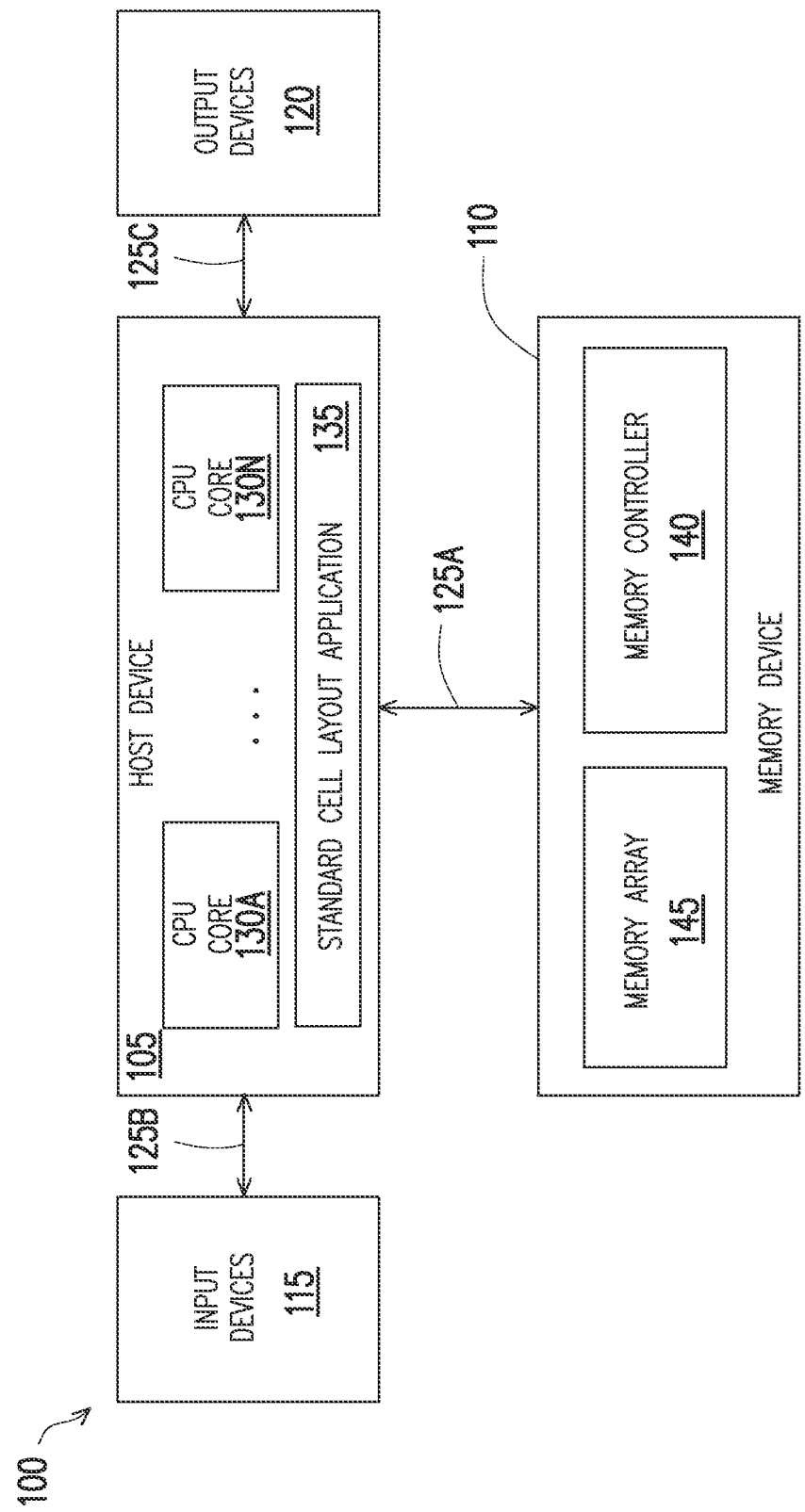
FIG. 1 is an example block diagram of a computing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a computing system 100 is shown, in accordance with some embodiments of the disclosure. The computing system 100 may be used by a circuit or layout designer for performing a standard cell layout of a circuit. A "circuit" as used herein is an interconnection of electrical components such as resistors, transistors, switches, batteries, inductors, or other types of semiconductor devices configured for implementing a desired functionality. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user (e.g., a circuit or layout designer), to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing unit. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations. One such application that the host device 105 may be configured to run may be a standard cell layout application 135. The standard cell layout application 135 may be part of a computer aided design or electronic design automation software suite that may be used by a user of the host device 105 to create a standard cell layout of a circuit. In some embodiments, the instructions needed to execute or run the standard cell layout application 135 may be stored within the memory device 110. The standard cell layout application 135 may be executed by one or more of the CPU cores 130A-130N using the instructions associated with the standard cell layout application from the memory device 110.

Referring still to FIG. 1, the memory device 110 includes a memory controller 140 that is configured to read data from or write data to a memory array 145. In some embodiments, the memory array 145 may be a one-time programmable ("OTP") memory array. The OTP memory array is a type of non-volatile memory that retains the data stored therein after the memory device 110 is powered off. In some embodiments, the OTP memory array may include a plurality of anti-fuse cells, each of which may be configured to store one or more bits of data, as described further below. In some embodiments, the memory array 145 may additionally include other types of volatile and/or non-volatile memories. For example, in some embodiments, the memory array 145 may also include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. Generally speaking, the memory array 145 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, cloud memory, or any combination of primary and/or secondary memory that is suitable for performing the operations described herein.

The memories within the memory array 145 may be individually and independently controlled by the memory controller 140. In other words, the memory controller 140 may be configured to communicate with each memory within the memory array 145 individually and independently. By communicating with the memory array 145, the memory controller 140 may be configured to read data from or write data to the memory array in response to instructions received from the host device 105. Although shown as being part of the memory device 110, in some embodiments, the memory controller 140 may be part of the host device 105 or part of another component of the computing system 100 and associated with the memory device. The memory controller 140 may be implemented as a logic circuit in either software, hardware, firmware, or combination thereof to perform the functions described herein. For example, in some embodiments, the memory controller 140 may be configured to retrieve the instructions associated with the standard cell layout application 135 stored in the memory array 145 of the memory device 110 upon receiving a request from the host device 105.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 140 and the memory array 145 may include other hardware, software, and/or firmware components that are considered necessary or desirable in performing the functions described herein.

Figure 2:
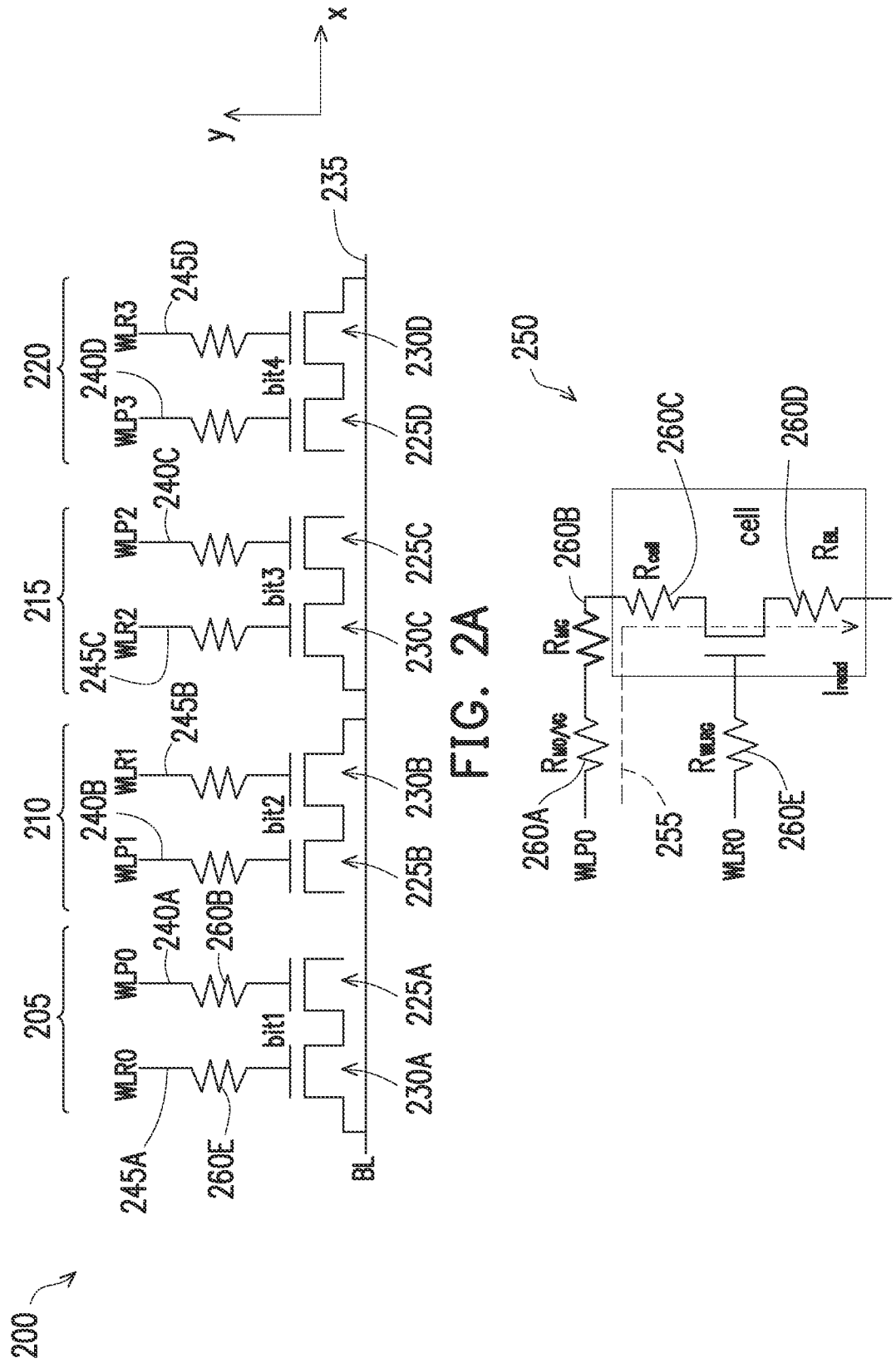
FIG. 2A is an example portion of an anti-fuse cell array, in accordance with some embodiments.
FIG. 2B is an example circuit diagram showing the resistances in an anti-fuse cell of the anti-fuse cell array of FIG. 1 during a read operation, in accordance with some embodiments.

Turning to FIG. 2A, an example anti-fuse cell array 200 is shown, in accordance with some embodiments of the present disclosure. The anti-fuse cell array 200 includes a first anti-fuse cell 205, a second anti-fuse cell 210, a third anti-fuse cell 215, and a fourth anti-fuse cell 220. In some embodiments, and as shown, each of the first anti-fuse cell 205, the second anti-fuse cell 210, the third anti-fuse cell 215, and the fourth anti-fuse cell 220 includes two transistors. Thus, each of the first anti-fuse cell 205, the second anti-fuse cell 210, the third anti-fuse cell 215, and the fourth anti-fuse cell 220 is a 2T cell configuration. In some embodiments, one or more of the first anti-fuse cell 205, the second anti-fuse cell 210, the third anti-fuse cell 215, and the fourth anti-fuse cell 220 may include a single transistor or greater than two transistors. Further, each of the first anti-fuse cell 205, the second anti-fuse cell 210, the third anti-fuse cell 215, and the fourth anti-fuse cell 220 may be configured to store one bit of data or multiple bits of data. Additionally, although four anti-fuse cells (e.g., the first anti-fuse cell 205, the second anti-fuse cell 210, the third anti-fuse cell 215, and the fourth anti-fuse cell 220) extending in a single row have been shown in the anti-fuse cell array 200, in some embodiments, greater than or fewer than four cells may be included in a single row, which extends in an X-direction, of the anti-fuse cell array. Further, while not shown in FIG. 2A, the anti-fuse cell array 200 may include anti-fuse cells extending in a Y-direction as well.

Moreover, although each of the first anti-fuse cell 205, the second anti-fuse cell 210, the third anti-fuse cell 215, and the fourth anti-fuse cell 220 has been shown as being an n-type transistor, in some embodiments, one or more of the first anti-fuse cell, the second anti-fuse cell, the third anti-fuse cell, and the fourth anti-fuse cell may be a p-type transistor. The first anti-fuse cell 205, the second anti-fuse cell 210, the third anti-fuse cell 215, and the fourth anti-fuse cell 220 each include a program transistor 225A, 225B, 225C, and 225D, respectively, that is configured to store one or more bits of data, and a read transistor 230A, 230B, 230C, and 230D, respectively, that is configured to facilitate reading of the one or more bits of data stored in the associated program transistor. A source or drain terminal of the read transistor 230A-230D of each of the first anti-fuse cell 205, the second anti-fuse cell 210, the third anti-fuse cell 215, and the fourth anti-fuse cell 220 is connected to a bit line 235. Thus, each of the first anti-fuse cell 205, the second anti-fuse cell 210, the third anti-fuse cell 215, and the fourth anti-fuse cell 220 include a program transistor (e.g., the program transistors 225A-225D) and a read transistor (e.g., the read transistors 230A-230D) and share the bit line 235.

Further, a gate terminal of the program transistor 225A-225D of each of the first anti-fuse cell 205, the second anti-fuse cell 210, the third anti-fuse cell 215, and the fourth anti-fuse cell 220 is connected to a program word line. Thus, the program transistor 225A of the first anti-fuse cell 205 is connected to a program word line, WLP0, 240A, the program transistor 225B of the second anti-fuse cell 210 is connected to a program word line, WLP1, 240B, the program transistor 225C of the third anti-fuse cell 215 is connected to a program word line, WLP2, 240C, and the program transistor 225D of the fourth anti-fuse cell 220 is connected to a program word line, WLP3, 240D. Each of the program word lines 240A-240D may be used to apply a programming voltage at a programming voltage level to program the associated one of the program transistors 225A-225D. Each of the program word lines 240A-240D may also be used to apply a read voltage at a read voltage level to read the data stored in the associated one of the program transistors 225A-225D.

To program one or more bits in the program transistor 225A, a programming voltage at the programming voltage level may be applied at the program word line 240A and a reference voltage may be applied at the bit line 235. A difference between the programming voltage and the reference voltage may produce an electric field across a dielectric semiconductor layer of the program transistor 225A. The electric field may be sufficiently large to sustainably alter (e.g., break down) the dielectric semiconductor layer of the program transistor 225A, thereby decreasing the resistance of the dielectric semiconductor layer and programming the data bit(s) in the program transistor. The program transistors 225B-225D may similarly be programmed via their respective one of the program word lines 240B-240D. The read transistor 230A-230D may be turned off during a programming operation.

Similarly, the gate terminal of the read transistors 230A-230D of each of the first anti-fuse cell 205, the second anti-fuse cell 210, the third anti-fuse cell 215, and the fourth anti-fuse cell 220 is connected to a read word line, WLR. For example, the read transistor 230A of the first anti-fuse cell 205 is connected to a read word line, WLR0, 245A, the read transistor 230B of the second anti-fuse cell 210 is connected to a read word line, WLR1, 245B, the read transistor 230C of the third anti-fuse cell 215 is connected to a read word line, WLR2, 245C, and the read transistor 230D of the fourth anti-fuse cell 220 is connected to a read word line, WLR3, 245D. Each of the read word lines 245A-245D may be used to apply a sufficient voltage to turn on the associated one of the read transistors 230A-230D for reading data stored in the associated one of the program transistors 225A-225D.

To read data stored within the program transistors 225A-225D, the associated one of the read transistors 230A-230D, respectively, may be turned on and a respective read voltage may be applied via the respective one of the program word lines 240A-240D. For example, to read data stored in the program transistor 225A, a sufficient voltage may be applied to the read word line 245A to turn on the read transistor 230A, a read voltage at a read voltage level may be applied at the program word line 240A, and a reference voltage may be applied to the bit line 235. A difference between the read voltage and the reference voltage creates an electric field across the dielectric semiconductor layer of the program transistor 225A. The electric field is sufficiently small to avoid sustainably altering the dielectric semiconductor layer, but large enough to generate a read current that flows through the read transistor 230A, which has been turned on. The read current flows through the bit line 235 and is sensed by a sense amplifier (not shown) connected to the bit line to read the bit(s) stored within the program transistor 225A. The magnitude and polarity of the read current may be dependent upon the magnitude and polarity of the read voltage applied at the program word line 240A relative to the reference voltage applied on the bit line 235, and one or more resistances discussed below. Similarly, the data stored in the program transistors 225B-225D may be read via the associated one of the read transistors 230B-230D, respectively, and the bit line 235.

Turning to FIG. 2B, an example circuit diagram 250 showing various resistances that may impact the read current flowing through an anti-fuse cell during a read operation is shown, in accordance with some embodiments of the present disclosure. Simply for explanation, the circuit diagram 250 explains the various resistances with respect to the read current flowing through the first anti-fuse cell 205 during a read operation. Thus, as indicated above, during the read operation, a read voltage is applied at the program word line 240A, a sufficient voltage to turn on the read transistor 230A is applied at the read word line 245A, and a reference voltage is applied at the bit line 235 to cause a read current 255 to flow. The magnitude of the read current 255 in the first anti-fuse cell 205 may be dependent upon various resistances encountered in the path of the read current. For example, the read current 255 may be dependent upon a $R_{MO/VG}$ resistance 260A, a $R_{MG}$ resistance 260B, a $R_{CELL}$ resistance 260C, and a $R_{BL}$ resistance 260D. Thus, the overall resistance in the path of the read current 255 may be given as follows:

$$R = R_{MO/VG} + R_{MG} + R_{CELL} + R_{BL}$$

The $R_{MO/VG}$ resistance 260A is the resistance in an interconnect layer between a polysilicon region in which the gate terminal of the first anti-fuse cell 205 is formed and an active or conductive region to which the polysilicon region is connected. In some embodiments, the active or conductive region may be an n-type or p-type active area of a planar transistor or a fin, field-effect transistor (FINFET). More specifically, the gate terminal of the program transistor 225A of the first anti-fuse cell 205 may be formed in a polysilicon semiconductor region during fabrication, and the polysilicon region may be connected to an active or conductive region through an interconnect layer (e.g., metal 0, metal 1, etc.) and a via to form an electrical connection between the active or conductive region and the polysilicon region. The read voltage (as well as the programming voltage) at the program word line 240A may be applied through the active or conductive region. The resistance in that conductive path is referred to herein as the $R_{MO/VG}$ resistance 260A.

The $R_{MG}$ resistance 260B is the resistance between the polysilicon region and the program transistor 225A, while the $R_{CELL}$ resistance 260C is the resistance of the bit(s) programmed within the program transistor 225A. The $R_{BL}$ resistance 260D is the resistance associated with the bit line 235. For example, the bit line 235 may be interconnected to another active or conductive region via an interconnect layer to provide a conductive path. The resistance in that interconnect layer/conductive path may be given by the $R_{BL}$ resistance 260D. Thus, in a read operation, to read a bit stored within the program transistor 225A, the program word line 240A causes the read current 255 to flow based upon values of the $R_{MO/VG}$ resistance 260A, the $R_{MG}$ resistance 260B, the $R_{CELL}$ resistance 260C, and the $R_{BL}$ resistance 260D. Higher the $R_{MO/VG}$ resistance 260A, the $R_{MG}$ resistance 260B, the $R_{CELL}$ resistance 260C, and the $R_{BL}$ resistance 260D, lower is the read current 360.

Thus, the present disclosure, in various embodiments, provides a mechanism to reduce the overall resistance (e.g., the sum of the $R_{MO/VG}$ resistance 260A, the $R_{MG}$ resistance 260B, the $R_{CELL}$ resistance 260C, and the $R_{BL}$ resistance 260D) to increase the read current 255. Specifically, the present disclosure, in various embodiments, provides a mechanism to reduce the overall resistances in the path of the read current 255 by eliminating or substantially eliminating the $R_{MG}$ resistance 260B. By eliminating or substantially eliminating the $R_{MG}$ resistance 260B, the overall resistance (e.g., the sum of the $R_{MO/VG}$ resistance 260A, the $R_{MG}$ resistance 260B, the $R_{CELL}$ resistance 260C, and the $R_{BL}$ resistance 260D) may be reduced, thereby increasing the read current 255 flowing through the first anti-fuse cell 205. Further, as indicated above, during the read operation a sufficient voltage may be applied on the read word line 245A to turn the read transistor 230A on and allowing the read current 255 to flow therethrough. The read word line 245A may be received at the read transistor 230A via a $R_{WLRG}$ resistance 260E. Because the path of the read current 255 does not include the $R_{WLRG}$ resistance 260E, the $R_{WLRG}$ resistance does not have an impact on the read current.

Although the example above has been explained with respect to the read current 255, by eliminating or substantially eliminating the $R_{MG}$ resistance 260B, the program current flowing through the first anti-fuse cell 205 during a programming operation may be increased as well. It is to be understood that while the circuit diagram 250 has been explained with respect to the first anti-fuse cell 205, the circuit diagram is similarly applicable to the read current and program current flowing through the second anti-fuse cell 210, the third anti-fuse cell 215, and the fourth anti-fuse cell 220.

Figure 3:
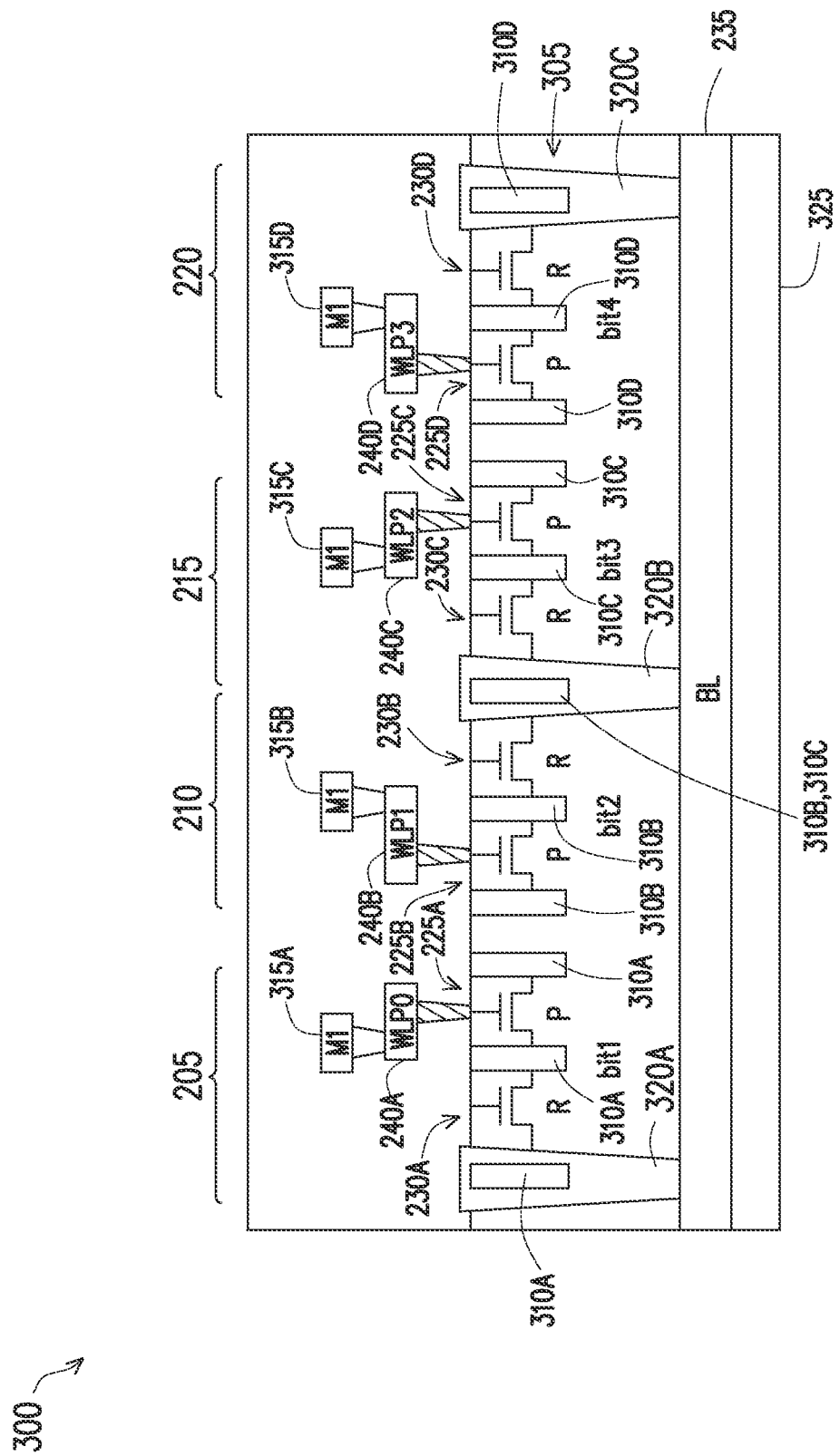
FIG. 3 is an example semiconductor cross-section of the portion of the anti-fuse cell array of FIG. 2 having a buried rail for a bit line, in accordance with some embodiments.

Referring to FIG. 3, an example semiconductor layer cross-section 300 of the anti-fuse cell array 200 is shown, in accordance with some embodiments of the present disclosure. The cross-section 300 shows a substrate 305 in which the first anti-fuse cell 205, the second anti-fuse cell 210, the third anti-fuse cell 215, and the fourth anti-fuse cell 220 are formed. The source and drain terminals of the program transistors 225A-225D and the read transistors 230A-230D of each of the first anti-fuse cell 205, the second anti-fuse cell 210, the third anti-fuse cell 215, and the fourth anti-fuse cell 220 are formed in an active region. The active region may be a fin-shaped region of one or more three-dimensional field-effect-transistors (e.g., FinFETs, gate-all-around (GAA) transistors), or an oxide-definition (OD) region of one or more planar metal-oxide-semiconductor field-effect-transistors (MOSFETs), such that the active region may serve as a source feature or drain feature of the respective transistor(s). The active region may extend along a cell row direction, such as the X-direction.

Thus, the source and drain terminals of the first anti-fuse cell 205 may be formed in an active region 310A, the source and drain terminals of the second anti-fuse cell 210 may be formed in an active region 310B, the source and drain terminals of the third anti-fuse cell 215 may be formed in an active region 310C, and the source and drain terminals of the fourth anti-fuse cell 220 may be formed in an active region 310D. In some embodiments, one or more of the active region 310A, the active region 310B, the active region 310C, and the active region 310D may be combined together. For example, in some embodiments, the active regions 310B and 310C may be combined together.

Further, the program word lines 240A-240D connected to the gate terminals of the respective one of the program transistors 225A-225D of each of the first anti-fuse cell 205, the second anti-fuse cell 210, the third anti-fuse cell 215, and the fourth anti-fuse cell 220, respectively, may be connected to an active region (not shown) through an interconnect layer (e.g., metal one layer) 315A-315D. Although not shown, the gate terminals of the respective one of the read transistors 230A-230D may also be connected to an active region (not shown) through an interconnect layer, which may be same as or different from the interconnect layer 315A-315D.

Additionally, the bit line 235 may be formed within the substrate 305 as a buried rail. In conventional mechanisms, the bit line 235 is formed overlying the physical integrated circuit device. For example, in the conventional mechanisms, the bit line 235 may be formed above (e.g., in the Y direction) the first anti-fuse cell 205, the second anti-fuse cell 210, the third anti-fuse cell 215, and the fourth anti-fuse cell 220 (e.g., overlying the program transistors 225A-225D and above the read transistors 230A-230D), at for example, the metal zero layer. When the bit line 235 is formed above the first anti-fuse cell 205, the second anti-fuse cell 210, the third anti-fuse cell 215, and the fourth anti-fuse cell 220, the read current 255 flowing through each of the anti-fuse cells is limited by the sum of the $R_{MO/VG}$ resistance 260A, the $R_{MG}$ resistance 260B, the $R_{CELL}$ resistance 260C, and the $R_{BL}$ resistance 260D, discussed above. However, by burying the bit line 235 within the substrate 305 as a buried rail and forming (e.g., in the Y direction) the bit line to underlie the active regions 310A-310D of the first anti-fuse cell 205, the second anti-fuse cell 210, the third anti-fuse cell 215, and the fourth anti-fuse cell 220, the $R_{MG}$ resistance 260B may be eliminated or substantially eliminated.

Thus, the bit line 235 may be formed at a first height from a bottom surface 325 of the substrate 305. The active regions 310A-310B may be formed at a second height from the bottom surface 325 of the substrate 305. By forming the bit line 235 under the active regions 310A-310D (e.g., underlying those active regions), the first height as measured from the bottom surface 325 of the substrate 305 is less than the second height as measured from the bottom surface of the substrate.

The bit line 235, which is buried within the substrate 305, may be connected to the source/drain terminals of the read transistors 230A-230D via the active regions 310A-310D in which the source/drain terminals (e.g., the terminal that is connected to the bit line) of the read transistors are formed. In some embodiments, the bit line 235, which is buried within the substrate 305, may be connected to the appropriate ones of the active regions 310A-310D via a metal over oxide layer 320A-320C. Specifically, the bit line 235 may be connected to the source or drain terminal of the read transistor 230A via the metal over oxide layer 320A, while the bit line may be connected to the source or drain terminal of the read transistor 230B and the read transistor 230C (that share the active regions 310B, 310C) via the metal over oxide later 320B, and the bit line may be connected to the read transistor 230D via the metal over oxide layer 320C. Although the read transistor 230B and the read transistor 230C have been shown as sharing the metal over oxide layer 320B, in some embodiments, a separate metal over oxide layer may be used for each of those read transistors. The metal over oxide layer 320A-320C may provide an electrical connection between the bit line 235 and the active regions 310A-310D. In some embodiments, another type of connection suitable for providing a conductive path between the bit line 235 and the active regions 310A-310D may be used.

By burying the bit line 235 into the substrate 305 as a buried rail, and by providing an electrical connection between the buried rail and the active regions 310A-310D in which the source or drain terminal of the read transistors 230A-230D that are connected to the bit line are formed, the $R_{MG}$ resistance 260B may be eliminated or substantially eliminated from the path of the read current 255. Specifically, since the bit line 235 is connected to the active regions 310A-310D, the read or program voltage on the program word lines 240A-240D of a particular anti-fuse cell during a read or program operation may be directly applied from the active region on which the program word line is formed to the active region to which the bit line is connected. Thus, the bit line 235 may bypass the length between the polysilicon region and the program transistor of the anti-fuse cell, thereby eliminating the $R_{MG}$ resistance 260B. The overall resistance in the path of the read current 255 (or the program current) using the bit line 235 that is buried may be given as:

$$R = R_{MO/VG} + R_{CELL} + R_{BL}$$

Thus, by burying the bit line 235 within the substrate 305, the read current 255 flowing through an anti-fuse cell during a read operation may be increased. Similarly, since the $R_{MG}$ resistance 260B also contributes to the overall resistance during a programming operation, by burying the bit line 235 within the substrate 305, the $R_{MG}$ resistance may be eliminated from a programming operation. Thus, both read and program performance may be enhanced by burying the bit line 235. Further, by burying the bit line 235 within the substrate 305, a sense amplifier sensing the read current 255 during a read operation may easily differentiate between consecutive read operations since the difference between the read current 255 (e.g., $I_{ON}$ current) flowing during the read operations and the current flowing between read operations (e.g., $I_{OFF}$ current) may be larger.

Figure 4:
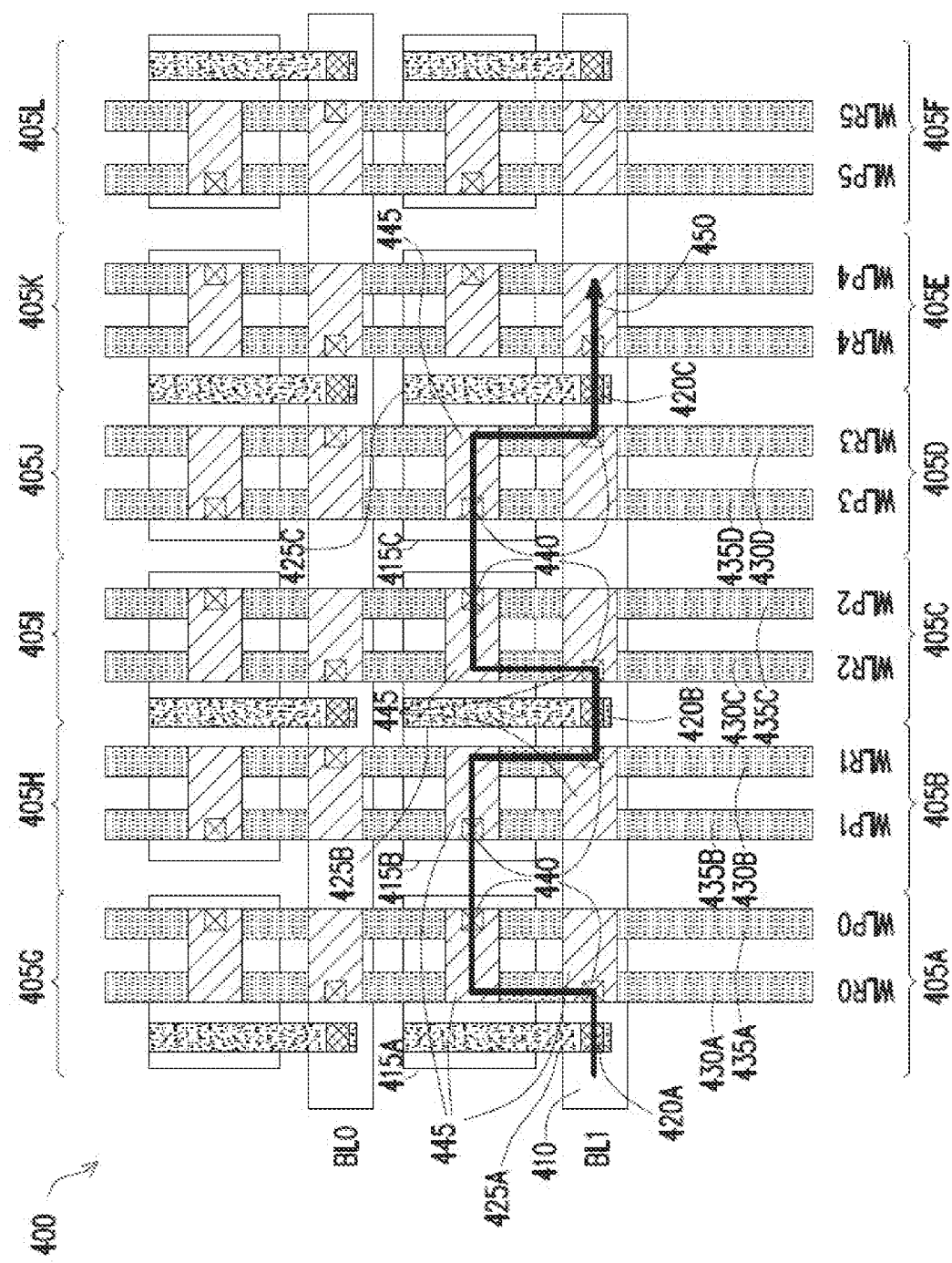
FIG. 4 is an example layout diagram of an anti-fuse cell array including the portion of the anti-fuse cell array of FIG. 2, in accordance with some embodiments.

Referring now to FIG. 4, an example layout diagram 400 of an anti-fuse cell array is shown, in accordance with some embodiments of the present disclosure. The layout diagram 400 shows twelve anti-fuse cells with six anti-fuse cells in each row. Thus, the layout diagram 400 shows the layout of a first anti-fuse cell 405A, a second anti-fuse cell 405B, a third anti-fuse cell 405C, a fourth anti-fuse cell 405D, a fifth anti-fuse cell 405E, a sixth anti-fuse cell 405F, a seventh anti-fuse cell 405G, an eighth anti-fuse cell 405H, a ninth anti-fuse cell 405I, a tenth anti-fuse cell 405J, an eleventh anti-fuse cell 405K, and a twelfth anti-fuse cell 405L. Although twelve anti-fuse cells are shown in the layout diagram 400, it is to be understood that the number of anti-fuse cells in the anti-fuse array from which the layout diagram is created may vary in other embodiments. Each of the first anti-fuse cell 405A, the second anti-fuse cell 405B, the third anti-fuse cell 405C, the fourth anti-fuse cell 405D, the fifth anti-fuse cell 405E, the sixth anti-fuse cell 405F, the seventh anti-fuse cell 405G, the eighth anti-fuse cell 405H, the ninth anti-fuse cell 405I, the tenth anti-fuse cell 405J, the eleventh anti-fuse cell 405K, and the twelfth anti-fuse cell 405L may be considered analogous to one of the first anti-fuse cell 205, the second anti-fuse cell 210, the third anti-fuse cell 215, and the fourth anti-fuse cell 220 discussed above.

For case of explanation, the description of the layout diagram 400 below is with respect to the first anti-fuse cell 405A, the second anti-fuse cell 405B, the third anti-fuse cell 405C, and the fourth anti-fuse cell 405D. However, the description below also applies to the fifth anti-fuse cell 405E, the sixth anti-fuse cell 405F, the seventh anti-fuse cell 405G, the eighth anti-fuse cell 405H, the ninth anti-fuse cell 405I, the tenth anti-fuse cell 405J, the eleventh anti-fuse cell 405K, and the twelfth anti-fuse cell 405L. For further case of explanation, the first anti-fuse cell 405A, the second anti-fuse cell 405B, the third anti-fuse cell 405C, and the fourth anti-fuse cell 405D are considered analogous to the first anti-fuse cell 205, the second anti-fuse cell 210, the third anti-fuse cell 215, and the fourth anti-fuse cell 220, respectively, discussed above.

Thus, each of the first anti-fuse cell 405A, the second anti-fuse cell 405B, the third anti-fuse cell 405C, and the fourth anti-fuse cell 405D share a bit line 410. The bit line 410 may be considered analogous to the bit line 235. Further, the bit line 410 may be a buried rail similar to the bit line 235. Thus, the bit line 410 may be formed within the substrate (e.g., the substrate 305) and underlying the active regions of the source/drain terminals of the read transistors to which the bit line is connected. The bit line 410 may be connected to the read transistors of the first anti-fuse cell 405A, the second anti-fuse cell 405B, the third anti-fuse cell 405C, and the fourth anti-fuse cell 405D via a metal over oxide layer. For example, the bit line 410 may be connected to an active region 415A through a via 420A and a metal over oxide layer 425A. Similarly, the bit line 410 may be connected to an active region 415B through a via 420B and a metal over oxide layer 425B, while the bit line may be connected to an active region 415C through a via 420C and a metal over oxide layer 425C. The active region 415A may be the region where the source or drain terminal (whichever is connected to the bit line 410) of the read transistor of the first anti-fuse cell 405A is formed. The active region 415B may be the region where the source or drain terminal (whichever is connected to the bit line 410) of the read transistors of the second anti-fuse cell 405B and the third anti-fuse cell 405C are formed. Thus, the second anti-fuse cell 405B and the third anti-fuse cell 405C share the active region 415B. The active region 415C may be the region where the source or drain terminal (whichever is connected to the bit line 410) of the read transistors of the fourth anti-fuse cell 405D and the fifth anti-fuse cell 405E are formed, and so on. Thus, by way of the via 420A-420C and the metal over oxide layer 425A-425C, the bit line 410 is connected to the first anti-fuse cell 405A, the second anti-fuse cell 405B, the third anti-fuse cell 405C, and the fourth anti-fuse cell 405D.

The layout diagram 400 also shows the polysilicon regions corresponding to the gate terminals of the read and program transistors of the first anti-fuse cell 405A, the second anti-fuse cell 405B, the third anti-fuse cell 405C, and the fourth anti-fuse cell 405D. Specifically, the layout diagram 400 shows a polysilicon region 430A associated with the read transistor of the first anti-fuse cell 405A, a polysilicon region 430B associated with the read transistor of the second anti-fuse cell 405B, a polysilicon region 430C associated with the read transistor of the third anti-fuse cell 405C, and a polysilicon region 430D associated with the read transistor of the fourth anti-fuse cell 405D. Similarly, the layout diagram 400 includes polysilicon regions 435A-435D associated with the program transistors of the first anti-fuse cell 405A, the second anti-fuse cell 405B, the third anti-fuse cell 405C, and the fourth anti-fuse cell 405D, respectively. Each of the polysilicon regions 430A-430D and 435A-435D is connected to an active region (not shown) through a via 440 and an interconnect layer (e.g., a metal zero layer) 445.

Further, in some embodiments, the first anti-fuse cell 405A, the second anti-fuse cell 405B, the third anti-fuse cell 405C, and the fourth anti-fuse cell 405D may be connected to each other via the bit line 410, such that current through those anti-fuse cells may flow as shown by an arrow 450. In some embodiments, as discussed below, the metal over oxide layers 425A-425C may be connected with each other using an interconnect layer to connect the various anti-fuse cells in the same row of the anti-fuse cell array.

Figure 5:
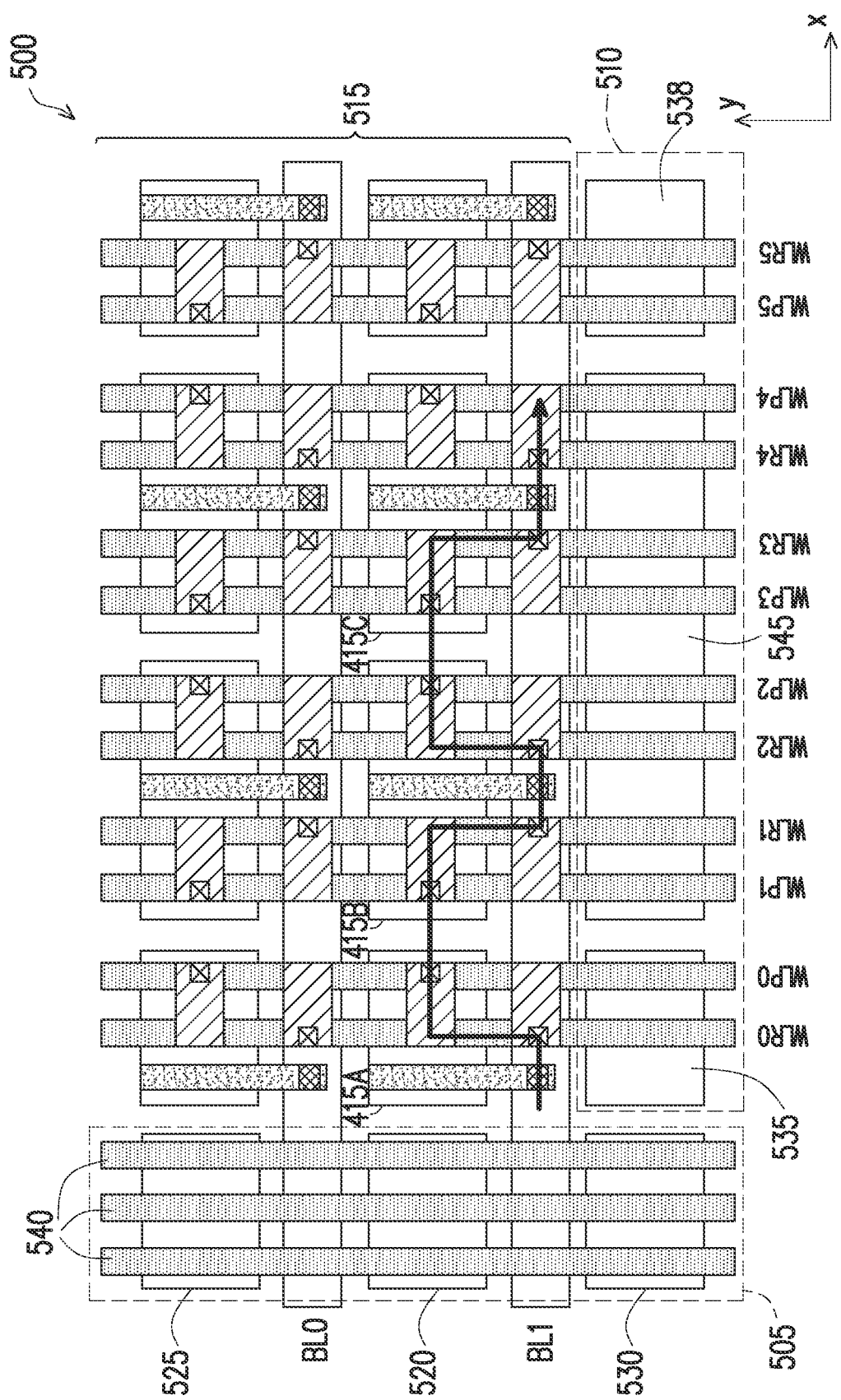
FIG. 5 is another example layout diagram of the anti-fuse cell array of FIG. 4, in accordance with some embodiments.

Turning to FIG. 5, an example layout diagram 500 for an anti-fuse cell array is shown, in accordance with some embodiments of the present disclosure. The layout diagram 500 includes a first protection block 505 and a second protection block 510 flanking a layout of an anti-fuse cell array 515. The layout diagram of the anti-fuse cell array 515 is same as the layout diagram 400, and therefore, has not been described again. The first protection block 505 and the second protection block 510 may be used to protect the anti-fuse cell array 515. The first protection block 505 and the second protection block 510 may be provided along an edge or boundary of the anti-fuse cell array 515. Further, the first protection block 505 extends in a vertical or substantially vertical direction that extends in a Y-direction, while the second protection block 510 extends in a horizontal or substantially horizontal direction that extends in an X-direction. Although the first protection block 505 and the second protection block 510 have been shown on two edges of the anti-fuse cell array 515, in some embodiments, the first protection block 505 and/or the second protection block 510 may be provided on the remaining edges or boundaries of the anti-fuse cell array as well.

In some embodiments, each of the first protection block 505 and the second protection block 510 may include one or more active regions and one or more dummy polysilicon regions. Generally speaking, the first protection block 505 may include at least one active region for each row of the anti-fuse cell array. A row of the anti-fuse cell array 515 extends in the X-direction, while a column of the anti-fuse cell array extends in the Y-direction. In some embodiments, the first protection block 505 may include a first active region 520 and a second active region 525. The height (e.g., in the Y-direction) of the first active region 520 may be same as or similar to the height of the active region of the anti-fuse cells of the anti-fuse cell array 515 in the same row. For example, in some embodiments, the height of the first active region 520 may be same as the height of one of the active region 415A-415C. Similarly, the height of the second active region 525 may be same as the height of at least one active region of the anti-fuse cells of the anti-fuse cell array 515 that are in the same row as the second active region. In some embodiments, the first protection block 505 may also include a third active region 530 that has the same or similar height as at least one active region in the second protection block 510. Further, one or more of the first active region 520, the second active region 525, or the third active region 530 may be connected to ground or left floating.

The first protection block 505 may also include at least one dummy polysilicon region. For example, as shown in FIG. 5, the first protection block 505 may include three polysilicon regions 540 in some embodiments. In other embodiments, the first protection block 505 may include greater than or fewer than three polysilicon regions. Since the polysilicon regions 540 are dummy, those polysilicon regions need not be connected to any active region.

The second protection block 510 may also include multiple active regions. In some embodiments, the height (e.g., in the Y-direction) of one or more of the active regions of the second protection block 510 may be same or similar to the height of the first active region 520 or the second active region 525 In other embodiments, the height of one or more of the active regions of the second protection block 510 may be different from the height of the active regions of the first protection block 505. Further, the width (e.g., in the X-direction) of the active regions of the second protection block 510 may vary and may be based upon a number of bits. For example, in some embodiments, an active region of the second protection block 510 may be one bit wide in the X-direction. In other embodiments, an active region of the second protection block 510 may be greater than one bit wide. Specifically, assuming that each of the first anti-fuse cell 405A, the second anti-fuse cell 405B, the third anti-fuse cell 405C, and the fourth anti-fuse cell 405D each store one bit of data, the active region 415A corresponds to storing one bit, and the active regions 415B and 415C each correspond to storing two bits. Thus, when the active region of the second protection block 510 is one bit wide, that active region may have a width that is same as or similar to the width of the active region 415A in the X-direction. For example, active regions 535 and 538 are each one bit wide. Active region 545, on the other hand, is four bits wide since that active region spans four bits (e.g., the active regions 415B and 415C).

Figure 6:
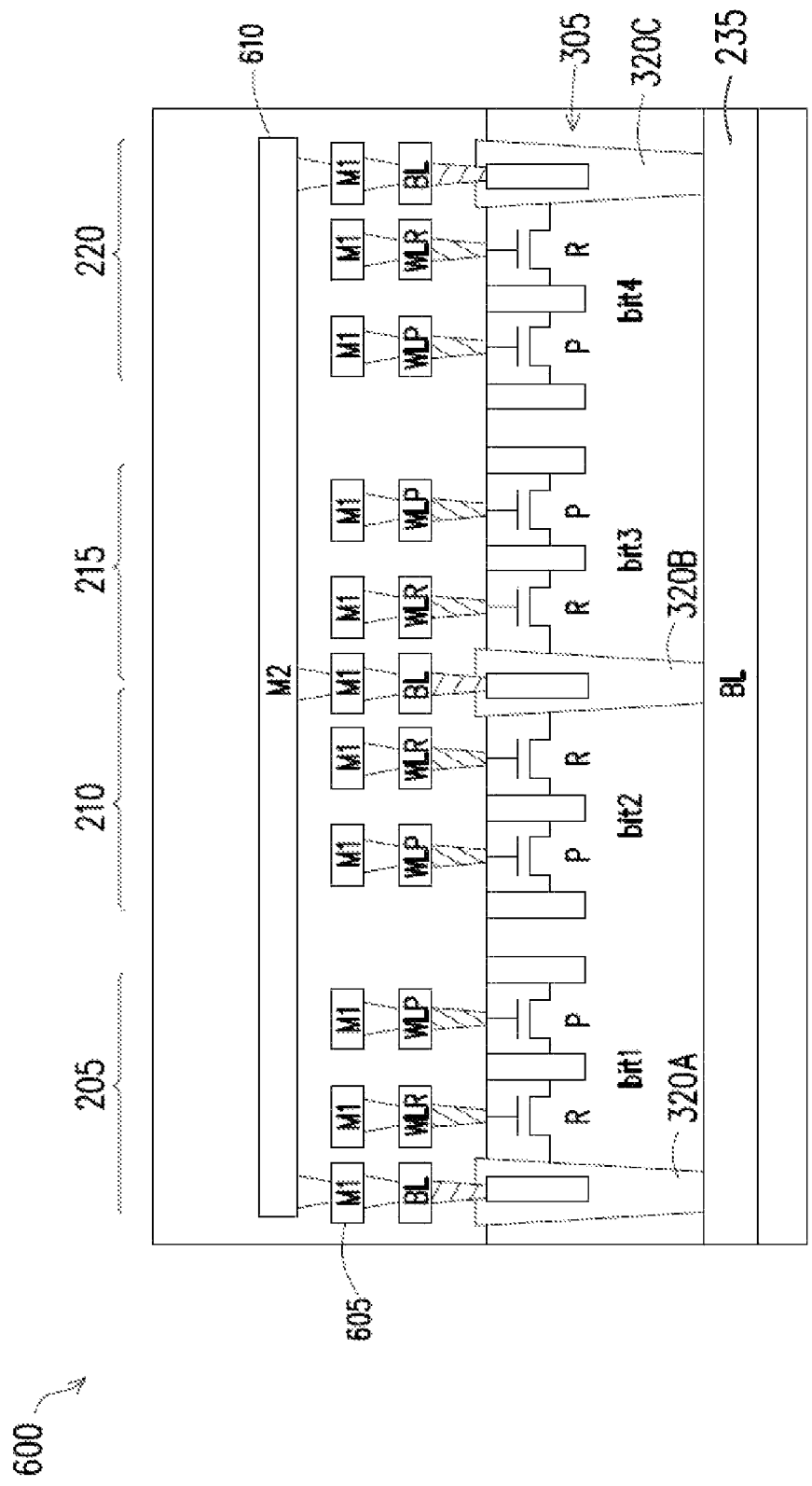
FIG. 6 is an example semiconductor cross-section of another portion of an anti-fuse cell array, in accordance with some embodiments.
Figure 7:
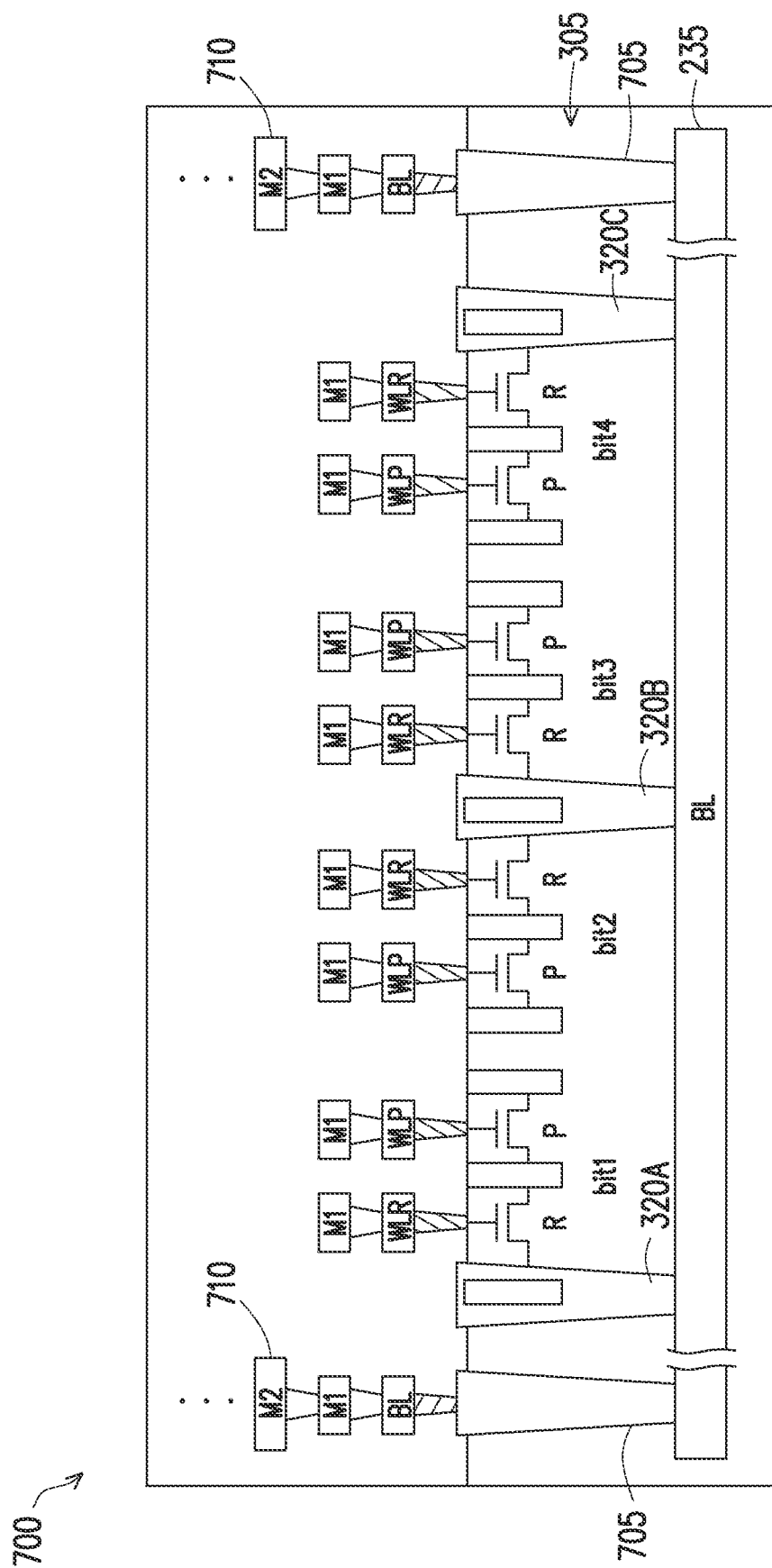
FIG. 7 is an example semiconductor cross-section of yet another portion of an anti-fuse cell array, in accordance with some embodiments.

Turning now to FIGS. 6 and 7, example semiconductor layer cross-sections 600 and 700, respectively, are shown, in accordance with some embodiments of the present disclosure. To The semiconductor layer cross-sections 600 and 700 are similar to the semiconductor layer cross-section 300 in that each of the semiconductor layer cross-sections 600 and 700 also include the bit line 235 that is a buried rail within the substrate 305, and connected to the first anti-fuse cell 205, the second anti-fuse cell 210, the third anti-fuse cell 215, and the fourth anti-fuse cell 220 via the metal over oxide layers 320A-320C. However, the semiconductor layer cross-sections 600 and 700 also show an interconnection between the bit line 235 and the word lines of the first anti-fuse cell 205, the second anti-fuse cell 210, the third anti-fuse cell 215, and the fourth anti-fuse cell 220.

For example, in some embodiments, and as shown in FIG. 6, the bit line 235 may be connected via the metal over oxide layers 320A-320C to interconnect layer 605 (e.g., metal one layer) to which the read and program word lines are connected. Further, an interconnect layer (e.g., metal two layer) 610 may be used to connect the metal over oxide layers 320A-320C. In some embodiments, and as shown in FIG. 7, separate metal over oxide layers 705 at ends of the bit line 235 may be used to connect the bit line 235 to the read and program word lines. The metal over oxide layers 705 may be connected to a higher interconnect layer 710 (e.g., metal two layer) to connect the metal over oxide layers 320A-320C.

Thus, by burying the bit line within the substrate (e.g., under the active regions of the anti-fuse cells) as a buried rail, the present disclosure, in various embodiments, provides a mechanism to reduce the overall resistance during read and program operations, thereby enhancing the performance of read and program operations. Although the bit line is discussed as being buried in the present disclosure, in various embodiments, one or more of the word lines may be buried instead of or in addition to the bit line. Further, although the present disclosure has been discussed with respect to anti-fuse cells, in some embodiments, the bit line may be buried to reduce resistance as discussed herein in other types of memories as well.

In accordance with some aspects of the present disclosure, a memory device is disclosed. The memory device includes an anti-fuse cell array having a plurality of anti-fuse cells, each of the plurality of anti-fuse cells having a first transistor and a second transistor connected to the first transistor. A first terminal of the first transistor is connected to a bit line and the bit line is a buried rail formed in a substrate of the first transistor and the second transistor.

In accordance with some other aspects of the present disclosure, memory cell is disclosed. The memory cell includes a first transistor having a first terminal, a second terminal, and a third terminal, and a second transistor having a fourth terminal, a fifth terminal, and a sixth terminal. The first terminal of the first transistor is connected to a bit line and the second terminal of the first transistor is connected to the fourth terminal of the second transistor, the third terminal of the first transistor is connected to a read word line, and the sixth terminal of the second transistor is connected to a program word line. The first terminal, the second terminal, the fourth terminal, and the fifth terminal are formed in an active region at a first height from a bottom surface of a substrate of the first transistor and the second transistor, and the bit line is a buried rail formed at a second height from the bottom surface of the substrate, the first height being greater than the second height.

In accordance with yet other aspects of the present disclosure, a method of generating a layout diagram is disclosed. The method includes connecting a first gate region of a first transistor of a first anti-fuse cell to a first conductive region through a first interconnect to form a read word line, connecting a second gate region of a second transistor of the first anti-fuse cell to a second conductive region through a second interconnect to form a program word line, and connecting a first terminal and a second terminal of the first transistor to an active region. The method also includes providing a bit line to underlie the active region, the first interconnect, and the second interconnect, and connecting the bit line to the active region through a first metal over oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a layout diagram, the method comprising:
    connecting a first gate region of a first transistor of a first anti-fuse cell to a first conductive region through a first interconnect to form a read word line;
    connecting a second gate region of a second transistor of the first anti-fuse cell to a second conductive region through a second interconnect to form a program word line;
    connecting a first terminal and a second terminal of the first transistor to an active region;
    providing a bit line to underlie the active region, the first interconnect, and the second interconnect;
    connecting the bit line to the active region through a first metal over oxide layer;
    connecting the bit line to a first edge metal over oxide layer at a first end of the bit line and a second edge metal over oxide layer at a second end of the bit line;
    connecting the first edge metal over oxide layer to the second metal over oxide layer through a third interconnect layer; and
    providing a first protection block extending in a first direction and a second protection block extending in a second direction to protect the first anti-fuse cell.

2. The method of claim 1, wherein the first interconnect and the second interconnect are part of a metal zero or higher interconnect layer.

3. The method of claim 1, wherein the first direction is perpendicular to the second direction.

4. The method of claim 1, wherein each of the first transistor and the second transistor is an n-type transistor or p-type transistor.

5. The method of claim 1, wherein the first protection block comprises at least one first dummy polysilicon region that is either floating or connected to ground.

6. The method of claim 5, wherein the second protection block comprises at least one second dummy polysilicon region that is either floating or connected to ground.

7. The method of claim 1, wherein each of the first protection block and the second protection block comprises a plurality of active regions.

8. The method of claim 1, wherein at least one of the first interconnect and the second interconnect is part of a metal zero or higher interconnect layer.

9. A method of generating a layout diagram, the method comprising:
    connecting a first terminal of a first transistor to a bit line;
    connecting a first active region of the first terminal to the bit line through a first metal over oxide layer;
    connecting the bit line to a first edge metal over oxide layer at a first end of the bit line and a second edge metal over oxide layer at a second end of the bit line;
    connecting the first edge metal over oxide layer to the second metal over oxide layer through an interconnect layer; and
    providing a first protection block comprising at least one first dummy polysilicon region that is either floating or connected to ground to protect an anti-fuse cell array, wherein the bit line is a buried rail formed in a substrate of the first transistor and a second transistor connected to the first transistor.

10. The method of claim 9, wherein the first protection block extends in a first direction along a first edge of the anti-fuse cell array.

11. The method of claim 10, further comprising providing a second protection block extending in a second direction along a second edge of the anti-fuse cell array.

12. The method of claim 11, wherein the second direction is perpendicular to the first direction.

13. The method of claim 10, wherein each of the first protection block and the second protection block comprises a plurality of active regions.

14. The method of claim 13, wherein a height in the first direction of a first one of the plurality of active regions of the first protection block is the same as a height of a second active region of one of a plurality of anti-fuse cells that is arranged in a same row as the first one of the plurality of active regions, wherein the row extends in the second direction.

15. The method of claim 13, wherein a width in the second direction of at least one of the plurality of active regions of the second protection block is the same as a width of a second active region of one of a plurality of anti-fuse cells configured to store one bit.

16. The method of claim 11, wherein each of the first protection block and the second protection block comprises a plurality of dummy polysilicon regions that are either floating or connected to ground.

17. The method of claim 16, wherein the plurality of dummy polysilicon regions comprises at least two dummy polysilicon regions.

18. A method of generating a layout diagram, the method comprising:
   connecting a first terminal of a first transistor to a bit line;
   connecting a first active region of the first terminal to the bit line through a first metal over oxide layer;
   connecting the bit line to a first edge metal over oxide layer at a first end of the bit line and a second edge metal over oxide layer at a second end of the bit line;
   connecting the first edge metal over oxide layer to the second metal over oxide layer through an interconnect layer; and
   providing a first protection block extending in a first direction and a second protection block extending in a second direction to protect an anti-fuse cell,
   wherein the bit line is a buried rail formed in a substrate of the first transistor and a second transistor connected to the first transistor.

19. The method of claim 18, wherein each of the first protection block and the second protection block comprises a plurality of active regions.

20. The method of claim 18, wherein each of the first protection block and the second protection block comprises a plurality of dummy polysilicon regions that are either floating or connected to ground.

* * * * *